(12) United States Patent
Hirochi

(10) Patent No.: US 11,553,565 B2
(45) Date of Patent: Jan. 10, 2023

(54) METHOD OF MANUFACTURING SEMICONDUCTOR DEVICE, SUBSTRATE PROCESSING APPARATUS, AND NON-TRANSITORY COMPUTER-READABLE RECORDING MEDIUM

(71) Applicant: KOKUSAI ELECTRIC CORPORATION, Tokyo (JP)

(72) Inventor: Yukitomo Hirochi, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 620 days.

(21) Appl. No.: 16/570,687

(22) Filed: Sep. 13, 2019

(65) Prior Publication Data
US 2020/0008275 A1 Jan. 2, 2020

Related U.S. Application Data

(63) Continuation of application No. PCT/JP2017/032845, filed on Sep. 12, 2017.

(30) Foreign Application Priority Data

Mar. 28, 2017 (JP) ................. 2017-062931

(51) Int. Cl.
*H05B 6/68* (2006.01)
*H05B 6/64* (2006.01)
*H01L 21/67* (2006.01)

(52) U.S. Cl.
CPC ......... *H05B 6/68* (2013.01); *H01L 21/67098* (2013.01); *H01L 21/67265* (2013.01); *H05B 6/6447* (2013.01)

(58) Field of Classification Search
CPC ......... H05B 6/6447; H05B 6/68; H05B 6/806
(Continued)

(56) References Cited

U.S. PATENT DOCUMENTS

2008/0127467 A1 6/2008 Hirano et al.
2015/0050815 A1* 2/2015 Yanagisawa ............ C23C 16/52
118/698

(Continued)

FOREIGN PATENT DOCUMENTS

JP 2010-080555 A 4/2010
JP 2015-070045 A 4/2015
(Continued)

OTHER PUBLICATIONS

International Search Report dated Dec. 19, 2017 of the PCT International Application No. PCT/JP2017/032845.

*Primary Examiner* — Quang T Van
(74) *Attorney, Agent, or Firm* — Volpe Koenig

(57) ABSTRACT

A substrate processing technology including: transferring a substrate to a process chamber and mounting the substrate on a substrate holder; heating the substrate with a heating device to perform predetermined substrate processing; determining the number of times of the predetermined substrate processing that has been performed that the predetermined substrate processing has been performed a preset number of times or more, determining whether it is necessary to adjust a mounting position at which the substrate is mounted on the substrate holder; and when it is determined that a mounting position adjustment is necessary, determining the mounting position by comparing the substrate temperature measured at the performing the predetermined substrate processing with a premeasured temperature of the substrate which corresponds to the mounting position and is stored in a memory.

12 Claims, 10 Drawing Sheets

(58) Field of Classification Search
USPC ....... 219/678, 686, 690, 695, 702, 710, 753,
219/754, 757, 748; 422/109, 288, 300,
422/327; 427/757, 532, 569, 575;
156/33, 435; 118/728, 719, 722, 724,
118/708, 725; 438/778, 798, 786
See application file for complete search history.

(56) References Cited

U.S. PATENT DOCUMENTS

2015/0144621 A1   5/2015  Hong et al.
2016/0284543 A1*  9/2016  Toyoda ............. H01J 37/32715
2021/0407865 A1* 12/2021  Shinozaki ............. F27D 5/0037

FOREIGN PATENT DOCUMENTS

JP       2015-103373 A    6/2015
JP       2016-186991 A   10/2016
KR   10-2015-0060567 A    6/2015
WO       2006/038584 A1   4/2006

* cited by examiner

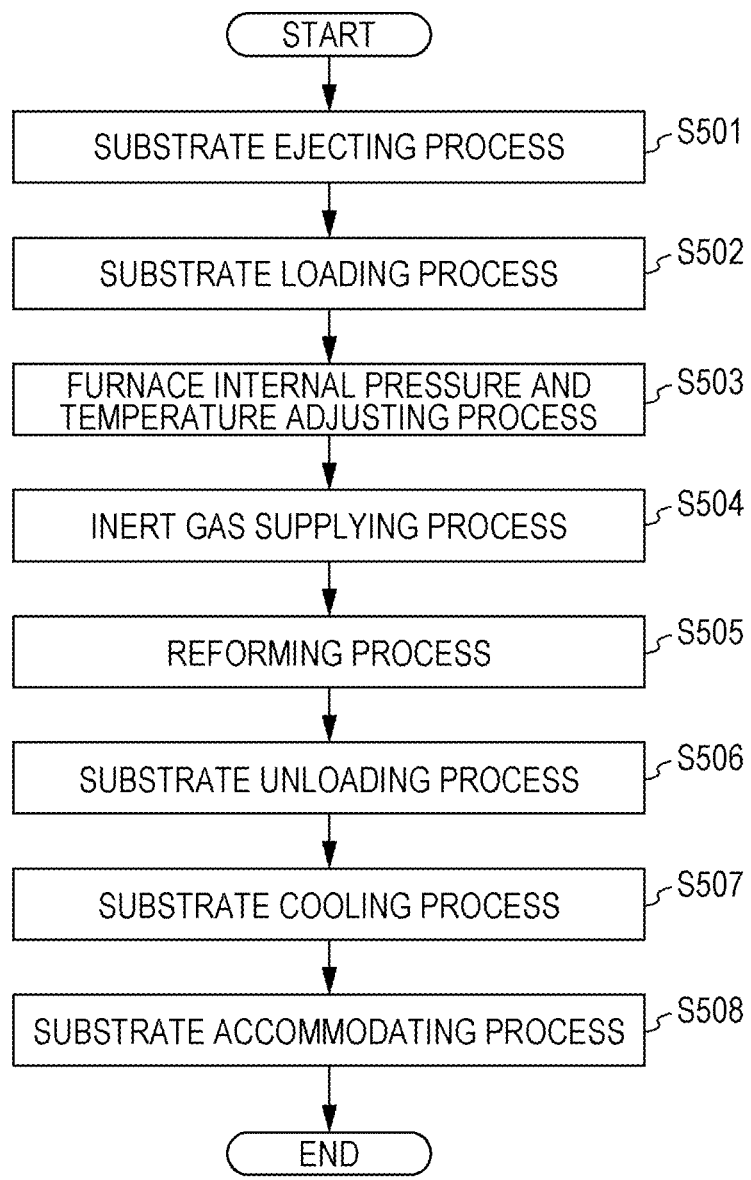

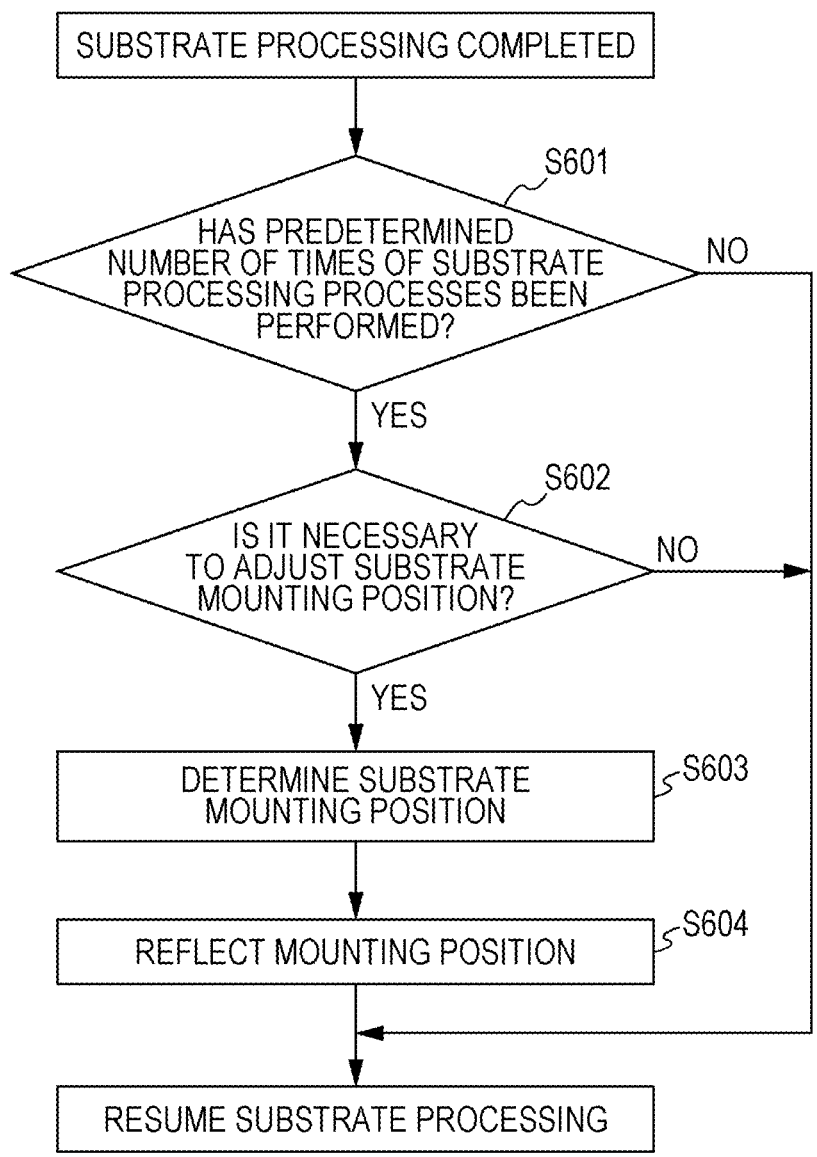

FIG. 7A

| | | WAFER POSITION | | TEMPERATURE (°C) | SHEET RESISTANCE RS (Ω/sq) | TEMPERATURE DIFFERENCE (°C) | ALLOWABLE RANGE (°C) |
|---|---|---|---|---|---|---|---|
| | POSITION | X-AXIS d₁ (mm) | Y-AXIS d₂ (mm) | | | | |
| PROCESS CHAMBER 201-1 | REFERENCE | 0 | 0 | 600 | 30 | - | -5 TO +5 |
| | No.1 | +3 | 0 | 590 | 31 | -10 | -15 TO -6 |
| | No.2 | 0 | -3 | 570 | 28 | -30 | -35 TO -26 |
| | No.3 | +1.5 | -1.5 | 580 | 29 | -20 | -25 TO -16 |
| | No.4 | -1.5 | -2 | 610 | 32 | +10 | +6 TO +15 |
| PROCESS CHAMBER 201-2 | REFERENCE | 0 | 0 | 600 | 30 | - | -5 TO +5 |
| | No.5 | -2 | 0 | 610 | 32 | +10 | +6 TO +15 |
| | No.6 | 0 | +1 | 570 | 28 | -30 | -35 TO -26 |
| | No.7 | -1.2 | +1.2 | 590 | 31 | -10 | -15 TO -6 |
| | No.8 | +2 | +1.3 | 580 | 29 | -20 | -25 TO -16 |

METHOD OF MANUFACTURING SEMICONDUCTOR DEVICE, SUBSTRATE PROCESSING APPARATUS, AND NON-TRANSITORY COMPUTER-READABLE RECORDING MEDIUM

CROSS-REFERENCE TO RELATED PATENT APPLICATION

This application is a Bypass Continuation application of PCT International Application No. PCT/JP2017/032845, filed on Sep. 12, 2017, the disclosure of which is incorporated herein in its entirety by reference.

TECHNICAL FIELD

This present disclosure relates to a method of manufacturing a semiconductor device, a substrate processing apparatus, and a non-transitory computer-readable recording medium.

BACKGROUND

As one of the processes of manufacturing a semiconductor device, for example, there is a reforming process, represented by an annealing process, of heating a substrate in a process chamber by using a heating device and changing a composition or a crystal structure in a thin film formed on the surface of the substrate or repairing crystal defects or the like in the formed thin film. In the recent semiconductor devices, a reforming process for a high-density substrate on which a pattern having a high aspect ratio is formed is required along with miniaturization and high integration. A heat treatment method using an electromagnetic wave has been studied as a reforming method for such a high-density substrate.

SUMMARY

In a conventional process using an electromagnetic wave, it may be difficult to uniformly process a substrate by changing an electromagnetic field distribution.

An object of this present disclosure is to provide an electromagnetic wave substrate processing technology capable of performing uniform substrate processing without adjusting an electromagnetic field distribution.

According to an aspect of this present disclosure, provided is a technology including: transferring a substrate to a process chamber and mounting the substrate on a substrate holder; heating the substrate with a heating device to perform predetermined substrate processing; determining the number of times of the predetermined substrate processing that has been performed after the performing of the predetermined substrate processing is completed; when it is determined, in the determining of the number of times of the predetermined substrate processing, that the predetermined substrate processing has been performed a preset number of times or more, determining whether it is necessary to adjust a mounting position at which the substrate is mounted on the substrate holder; and when it is determined, in the determining of whether it is necessary to adjust the mounting position, that a mounting position adjustment is necessary, determining the mounting position by comparing the substrate temperature measured at the performing the predetermined substrate processing with a premeasured temperature of the substrate which corresponds to a mounting position and is stored in a memory.

BRIEF DESCRIPTION OF DRAWINGS

FIG. 5 is a diagram illustrating a flow of substrate processing in this present disclosure.

FIG. 6 is a diagram illustrating a flow of substrate placement position adjustment in this present disclosure.

FIG. 7A is a schematic diagram illustrating a table in which holding positions of a substrate are stored.

DETAILED DESCRIPTION

Embodiment of the Present Disclosure

Hereinafter, an embodiment of this present disclosure will be described with reference to the drawings.

In the present embodiment, the substrate processing apparatus 100 according to this present disclosure is configured as a single wafer type processing apparatus that performs various heat treatments on a wafer, and will be described as an apparatus that performs an annealing process (reforming process) using an electromagnetic wave described later. In the substrate processing apparatus 100 according to this present disclosure, a front opening unified pod (FOUP) (hereinafter referred to as a pod) 110 is used as an accommodation vessel (carrier) in which a wafer 200 as a substrate is accommodated. The pod 110 is also used as a transfer vessel for transferring the wafer 200 between various substrate processing apparatuses.

Figure 1:
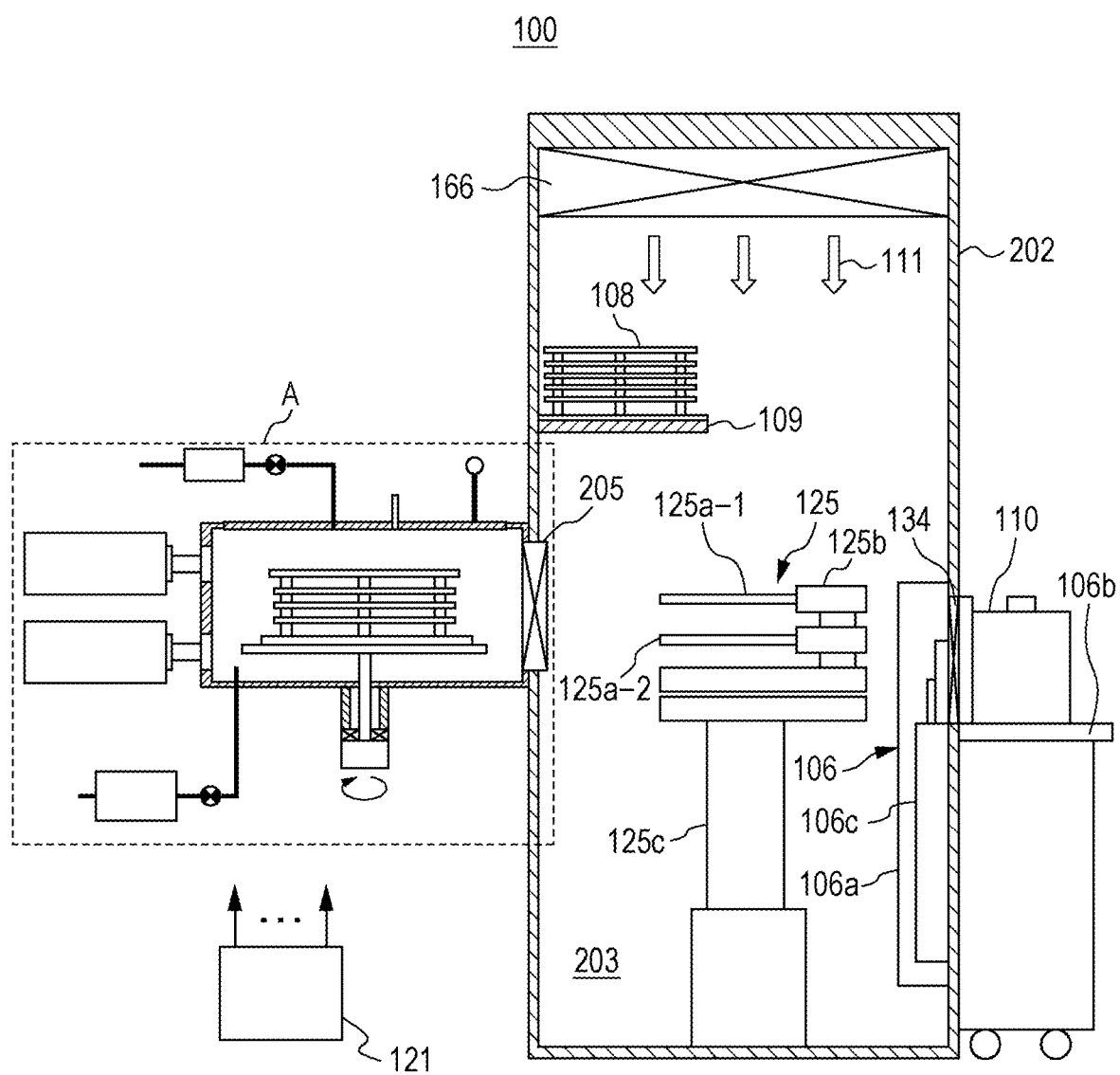
FIG. 1 is a longitudinal sectional view illustrating a schematic configuration of a substrate processing apparatus that is suitably used in an embodiment of this present disclosure.
Figure 2:
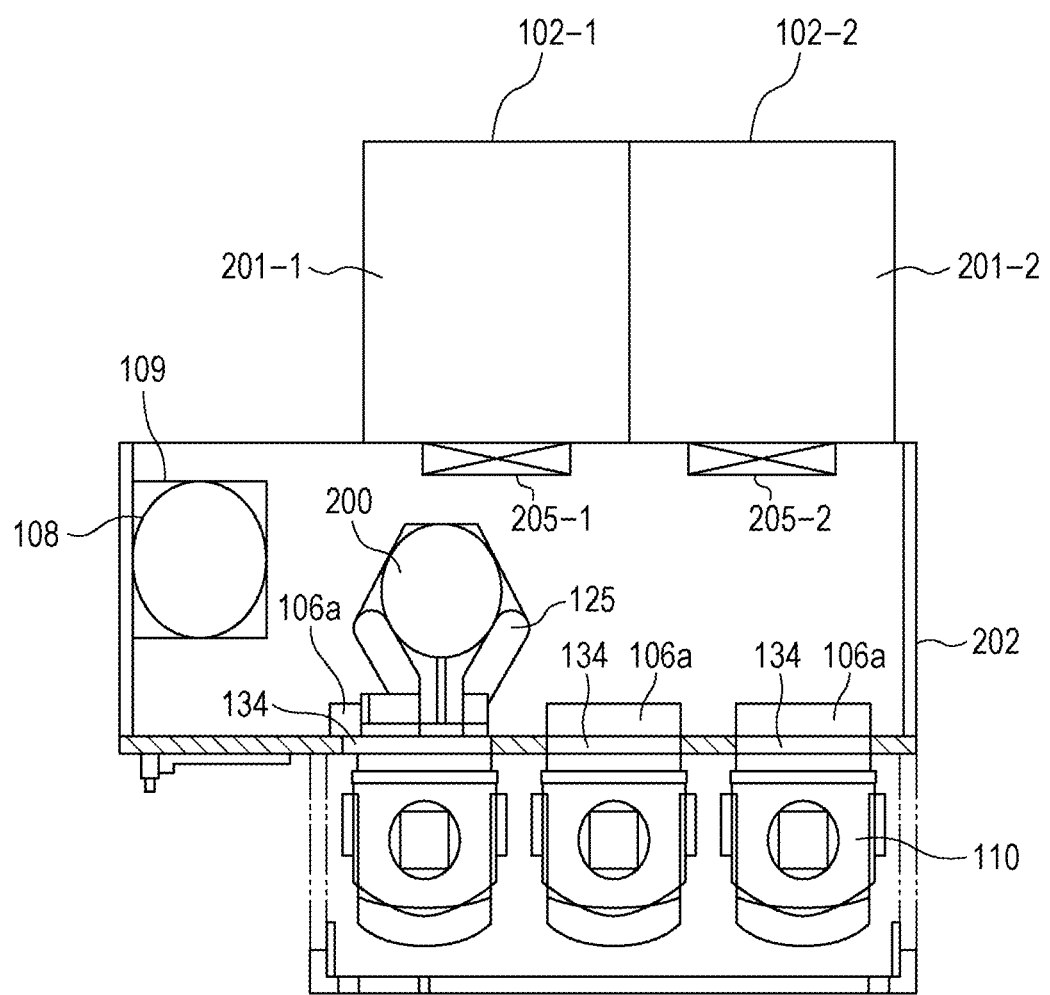
FIG. 2 is a cross-sectional view illustrating the schematic configuration of the substrate processing apparatus that is suitably used in the embodiment of this present disclosure.

As illustrated in FIGS. 1 and 2, the substrate processing apparatus 100 includes a transfer housing (housing) 202 having a transfer chamber (transfer area) 203 that transfers the wafer 200, and cases 102-1 and 102-2 as process vessels (described later) that are provided on side walls of the transfer housing 202 and have process chambers 201-1 and 201-2 that process the wafer 200. On the right side of FIG. 1 (lower side of FIG. 2) that is the front side of the transfer chamber 203, a load port unit (LP) 106 serving as a pod opening/closing mechanism is disposed to open/close the lid of the pod 110 and transfer/unload the wafer 200 to/from the transfer chamber 203. The load port unit 106 includes a housing 106a, a stage 106b, and an opener 106c. The stage 106b is configured to mount the pod 110 and bring the pod 110 close to a substrate loading/unloading port 134 formed in front of the housing of the transfer chamber 203. A lid (not illustrated) provided on the pod 110 is opened/closed by the opener 106c. In addition, the load port unit 106 may have a function of purging the inside of the pod 110 with a purge gas such as $N_2$ gas. In addition, the housing 202 has a purge gas circulation structure (described later) for circulating the purge gas such as $N_2$ in the transfer chamber 203.

On the left side of FIG. 1 (upper side of FIG. 2) that is the rear side of the housing 202 of the transfer chamber 203, gate valves 205-1 and 205-2 that open/close the process chambers 201-1 and 202-2 are respectively disposed. In the transfer chamber 203, a transfer device 125 serving as a substrate transfer mechanism (substrate transfer robot) that transfers the wafer 200 is installed. The transfer device 125 includes tweezers (arms) 125a-1 and 125a-2 serving as a mounting portion on which the wafer 200 is mounted, a transfer device 125b capable of rotating or linearly moving each of the tweezers 125a-1 and 125a-2 in a horizontal direction, and a transfer device elevator 125c that lifts and lowers the transfer device 125b. By continuous operation of the tweezers 125a-1 and 125a-2, the transfer device 125b, and the transfer device elevator 125c, the wafer 200 may be charged or discharged into or from a substrate holder 217 (described later) or the pod 110. Hereinafter, the cases 102-1 and 102-2, the process chambers 201-1 and 201-2, and the tweezers 125a-1 and 125a-2 will be simply described as the case 102, the process chamber 201, and the tweezers 125a, unless they are needed to be particularly described in a distinguishing manner.

As illustrated in FIG. 1, in the upper space of the transfer chamber 203 and below a clean unit 166 described later, a wafer cooling mounting tool 108 for cooling the processed wafer 200 is provided on a wafer cooling rack (wafer cooling table) 109. The wafer cooling mounting tool 108 has the same structure as a boat 217 serving as a substrate holder described later, and is configured to be able to horizontally hold a plurality of wafers 200 vertically in multiple stages by a plurality of wafer holding grooves. The wafer cooling mounting tool 108 and the wafer cooling rack 109 are provided above the installation positions of the substrate loading/unloading port 134 and the gate valve 205. Since wafer cooling mounting tool 108 and the wafer cooling rack 109 are separated on the movement line when the wafer 200 is transferred from the pod 110 to the process chamber 201 by the transfer device 125, it is possible to cool the processed wafer 200 without reducing the throughput of the wafer processing. Hereinafter, the wafer cooling mounting tool 108 and the wafer cooling rack 109 may be collectively referred to as a cooling area.

Figure 3:
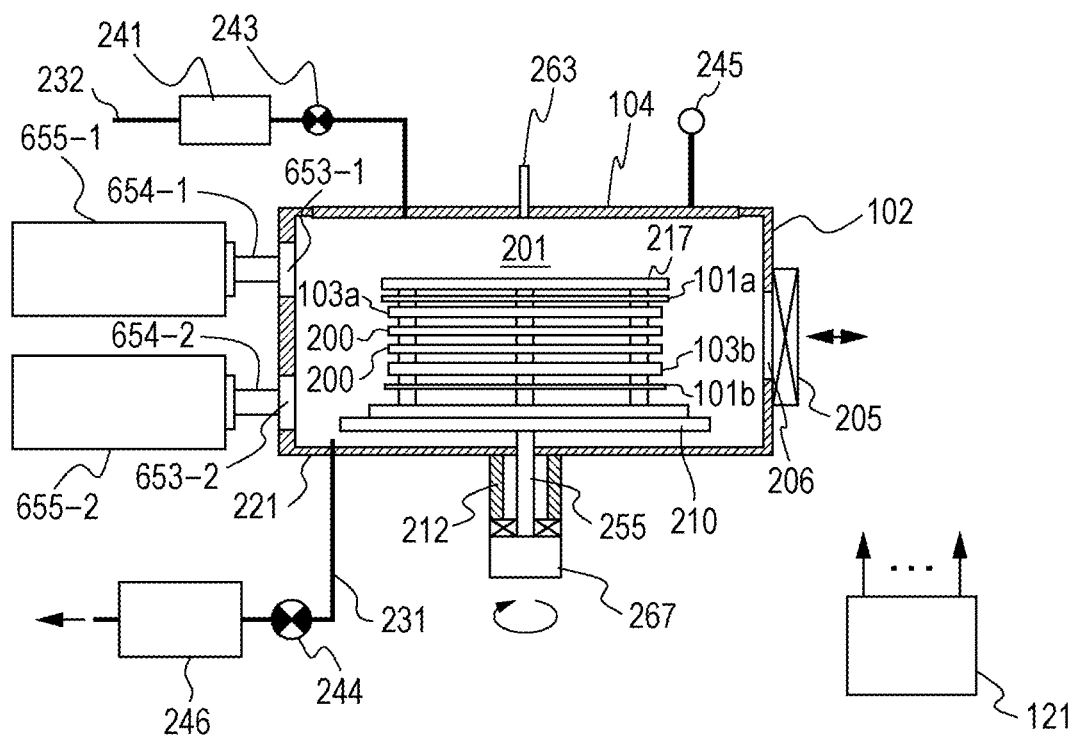
FIG. 3 is a schematic configuration diagram of a single wafer type process furnace of a substrate processing apparatus that is suitably used in an embodiment of this present disclosure and a longitudinal sectional view of a process furnace part.

A process furnace having a substrate processing structure as illustrated in FIG. 3 is configured in an area A surrounded by a broken line in FIG. 1. As illustrated in FIG. 2, although a plurality of process furnaces is provided in the present embodiment, the configurations of the process furnaces are the same. Therefore, only one configuration will be described, and the description of the configurations of the other process furnaces will be omitted.

As illustrated in FIG. 3, the process furnace includes a case 102 as a cavity (process vessel) made of a material, such as a metal, which reflects an electromagnetic wave. In addition, a cap flange (closing plate) 104 made of a metal material is configured to close the upper end of the case 102 via an O-ring (not illustrated) serving as a seal member. The inner space of the case 102 and the cap flange 104 is mainly configured as a process chamber 201 that processes a substrate such as a silicon wafer. A reaction tube (not illustrated) made of quartz that transmits an electromagnetic wave may be installed inside the case 102, or the process vessel may be configured such that the inside of the reaction tube becomes a process chamber. In addition, the process chamber 201 may be configured by using the case 102 whose ceiling is closed, without providing the cap flange 104.

A mounting table 210 is provided inside the process chamber 201, and a boat 217 serving as a substrate holder for holding the wafer 200 serving as the substrate is mounted on the mounting table 210. The boat 217 includes wafer holding pillars (boat pillars) 217a, 217b, and 217c that hold the wafers 200 as illustrated in FIGS. 8A to 8E described later, and end plates are disposed at both ends of the boat pillars 217a to 217c. In the present embodiment, the respective holding pillars 217a to 217c are formed in the same shape. The holding pillar 217a and the holding pillar 217b, and the holding pillar 217a and the holding pillar 217c are arranged at an interval of 90 degrees along the circumferential direction of the wafer 200. The holding pillar 217b and the holding pillar 217c are arranged at an interval of 180 degrees along the circumferential direction of the wafer 200. That is, the interval between the holding pillar 217a and the holding pillar 217b and the interval between the holding pillar 217a and the holding pillar 217c are disposed to be smaller than the interval between the holding pillar 217b and the holding pillar 217c. In the respective holding pillars 217a to 217c, a plurality of holding grooves (not illustrated) is disposed at equal intervals in the longitudinal direction, and furthermore, are disposed at the same height, such that the wafer 200 can be horizontally held in the same plane. In addition, in the boat 217, the wafer 200 to be processed and quartz plates 101a and 101b serving as heat insulating plates mounted vertically above and below the wafer 200 so as to sandwich the wafer 200 are held at a predetermined interval. In addition, for example, susceptors 103a and 103b (also referred to as energy conversion members, radiation plates, and heat equalizing plates) may be mounted between the quartz plates 101a and 101b and the wafer 200 to indirectly heat the wafer 200. The susceptors are made of a dielectric material, such as a dielectric, which absorbs an electromagnetic wave and heat itself. Examples of the dielectric material include a silicon plate (Si plate) or a silicon carbide plate (SiC plate). With this configuration, it is possible to heat the wafer 200 more efficiently and uniformly by the radiant heat from the susceptors 103a and 103b. In the present embodiment, the quartz plates 101a and 101b and the susceptors 103a and 103b are the same components, respectively. Hereinafter, the quartz plates 101a and 101b and the susceptors 103a and 103b will be referred to as the quartz plate 101 and the susceptor 103, unless they are needed to be particularly described in a distinguishing manner.

The case 102 serving as the process vessel has, for example, a circular cross-section and is configured as a flat closed vessel. In addition, a transfer vessel 202 serving as a lower vessel is made of, for example, a metal material such as aluminum (Al) or stainless steel (SUS), quartz, or the like. The space enclosed by the case 102 may be referred to as the process chamber 201 or a reaction area 201 as a process space, and the space enclosed by the transfer vessel 202 may be referred to as a transfer chamber 203 or a transfer area 203 as a transfer space. The process chamber 201 and the transfer chamber 203 are not limited to being configured to be horizontally adjacent as in the present embodiment, but may be configured to be vertically adjacent.

As illustrated in FIGS. 1, 2, and 3, a substrate loading/unloading port 206 that is adjacent to a gate valve 205 is provided on the side surface of the transfer vessel 202, and the wafer 200 moves between the process chamber 201 and the transfer chamber 203 through the substrate loading/unloading port 206. A choke structure having a length of ¼ wavelength of an electromagnetic wave used is provided around the gate valve 205 or the substrate loading/unloading port 206 as a measure against electromagnetic wave leakage described later.

An electromagnetic wave supply section serving as a heating device described in detail later is installed on the side surface of the case 102. An electromagnetic wave such as a microwave supplied from the electromagnetic wave supply section is introduced into the process chamber 201 to heat the wafer 200 and the like and processes the wafer 200.

The mounting table 210 is supported by a shaft 255 serving as a rotational shaft. The shaft 255 penetrates the bottom of the case 102 and is further connected to a driving mechanism 267 that performs a rotation operation outside the transfer vessel 202. The wafer 200 mounted on the boat 217 can be rotated by operating the driving mechanism 267 to rotate the shaft 255 and the mounting table 210. The periphery of the lower end of the shaft 255 is covered with bellows 212, and the inside of the process chamber 201 and the transfer area 203 are airtightly held.

Here, the mounting table 210 may be configured to be lifted or lowered by the driving mechanism 267 according to the height of the substrate loading/unloading port 206 such that the wafer 200 is at the wafer transfer position when the wafer 200 is transferred, and may be configured such that the wafer 200 is lifted or lowered to the process position (wafer processing position) in the process chamber 201 at the time of processing the wafer 200.

An exhaust portion that exhausts the atmosphere of the process chamber 201 is provided below the process chamber 201 and on the outer peripheral side of the mounting table 210. As illustrated in FIG. 1, an exhaust port 221 is provided in the exhaust portion. An exhaust pipe 231 is connected to the exhaust port 221, and a pressure regulator 244 and a vacuum pump 246 are sequentially connected in series with the exhaust pipe 231. The pressure regulator 244 may include an APC valve for controlling a degree of valve opening according to a pressure in the process chamber 201.

Here, the pressure regulator 244 is not limited to the APC valve as long as it can receive pressure information in the process chamber 201 (a feedback signal from a pressure sensor 245 described later) and adjust an exhaust amount, and a general on-off valve and a general pressure regulation valve may be used in combination.

An exhaust portion (also referred to as an exhaust system or an exhaust line) is mainly configured by the exhaust port 221, the exhaust pipe 231, and the pressure regulator 244. The exhaust port may be provided so as to surround the mounting table 210 and may be configured such that gas can be exhausted from the entire periphery of the wafer 200. In addition, the vacuum pump 246 may be added to the configuration of the exhaust portion.

The cap flange 104 is provided with a gas supply pipe 232 for supplying process gases for a variety of substrate processing, such as an inert gas, a precursor gas, a reactant gas, and the like into the process chamber 201.

A mass flow controller (MFC) 241 that is a flow rate controller (flow rate control section) and a valve 243 that is an on-off valve are provided in the gas supply pipe 232 in this order from the upstream. For example, a nitrogen ($N_2$) gas source as an inert gas is connected to the upstream side of the gas supply pipe 232 and supplied to the process chamber 201 through the MFC 241 and the valve 243. In the case of using a plurality of types of gases at the time of substrate processing, a plurality of types of gases may be supplied by using a configuration in which a gas supply pipe provided with an MFC serving as a flow rate controller and a valve serving as an on-off valve are connected downstream of the valve 243 of the gas supply pipe 232 from the upstream side. The gas supply pipe provided with the MFC and the valve may be installed for each gas type.

A gas supply system (gas supply section) is mainly configured by the gas supply pipe 232, the MFC 241, and the valve 243. When an inert gas is allowed to flow through the gas supply system, the gas supply system is also referred to as an inert gas supply system. In addition to the $N_2$ gas, a rare gas, such as an Ar gas, a He gas, a Ne gas, or a Xe gas can also be used as the inert gas.

In the cap flange 104, a temperature sensor 263 is provided as a non-contact type temperature measurement device. An output of a microwave oscillator 655 described later is adjusted based on temperature information detected by the temperature sensor 263, such that the substrate is heated and the substrate temperature has a desired temperature distribution. The temperature sensor 263 is constituted by, for example, a radiation thermometer such as an infrared radiation (IR) sensor. The temperature sensor 263 is installed to measure the surface temperature of the quartz plate 101a or the surface temperature of the wafer 200. When the susceptor serving as the heating element described above is provided, the surface temperature of the susceptor may be measured. The case in which the temperature of the wafer 200 (wafer temperature) as described in this present disclosure refers to the case of meaning the wafer temperature converted by temperature conversion data described later, that is, the estimated wafer temperature, the case of meaning the temperature acquired by measuring the temperature of the wafer 200 directly by the temperature sensor 263, and the case of meaning both of them.

Temperature conversion data showing a correlation of the quartz plate 101 or the susceptor 103 by the temperature sensor 263, the quartz plate 101 or the susceptor 103 by previously acquiring the transition of the temperature change for each wafer 200, and the temperature of the wafer 200 may be stored in the memory device 121c or the external memory device 123. As such, by creating the temperature conversion data in advance, the temperature of the wafer 200 makes it possible to estimate the temperature of the wafer 200 by measuring only the temperature of the quartz plate 101. Based on the estimated temperature of the wafer 200, the output of the microwave oscillator 655, that is, the heating device can be controlled.

The means for measuring the temperature of the substrate is not limited to the above-described radiation thermometer. The temperature measurement may be performed by using a thermocouple, or the temperature measurement may be performed by using both the thermocouple and the non-contact type thermometer. However, when temperature measurement is performed by using the thermocouple, it is necessary to arrange the thermocouple in the vicinity of the wafer 200 to perform temperature measurement. That is, since it is necessary to arrange the thermocouple in the process chamber 201, the thermocouple itself is heated by the microwave supplied from the microwave oscillator described later, and thus the temperature cannot be measured accurately. Therefore, a non-contact type thermometer is preferably used as the temperature sensor 263.

In addition, the temperature sensor 263 is not limited to being provided on the cap flange 104, and may be provided on the mounting table 210. In addition, the temperature sensor 263 may be not only directly provided on the cap flange 104 or the mounting table 210, but also may indirectly measure radiation light from the measurement window provided on the cap flange 104 or the mounting table 210 by reflecting the radiation light with a mirror or the like. Furthermore, the temperature sensor 263 is not limited to one temperature sensor, and a plurality of temperature sensors may be installed.

Electromagnetic wave introduction ports 653-1 and 653-2 are provided on the sidewall of the case 102. One ends of waveguides 654-1 and 654-2 for supplying an electromagnetic wave to the process chamber 201 are respectively connected to the electromagnetic wave introduction ports 653-1 and 653-2. The microwave oscillators (electromagnetic wave sources) 655-1 and 655-2 serving as the heating sources for heating the process chamber 201 by supplying electromagnetic waves to the process chamber 201 are respectively connected to the other ends of the waveguides 654-1 and 654-2. The microwave oscillators 655-1 and 655-2 supply electromagnetic waves, such as microwaves, to the waveguides 654-1 and 654-2, respectively. In addition, as the microwave oscillators 655-1 and 655-2, magnetron, klystron, or the like is used. Hereinafter, the electromagnetic wave introduction ports 653-1 and 653-2, the waveguides 654-1 and 654-2, and the microwave oscillators 655-1 and 655-2 are described as the electromagnetic wave introduction port 653, the waveguide 654, and the microwave oscillator 655, unless they are needed to be particularly described in a distinguishing manner.

A frequency of the electromagnetic wave generated by the microwave oscillator 655 is preferably controlled so as to be in a frequency range of 13.56 MHz to 24.125 GHz. More preferably, the frequency of the electromagnetic wave is controlled to have a frequency of 2.45 GHz or 5.8 GHz. The respective frequencies of the microwave oscillators 655-1 and 655-2 may be the same frequency, or the microwave oscillators 655-1 and 655-2 may be installed at different frequencies.

In addition, in the present embodiment, although two microwave oscillators 655 are described as being disposed on the side of the case 102, this present disclosure is not limited thereto. One or more microwave oscillators may be provided, and the microwave oscillators may be disposed on different side surfaces such as opposite side surfaces of the case 102. An electromagnetic wave supply section (also referred to as an electromagnetic wave supply device, a microwave supply section, or a microwave supply device) serving as a heating device is mainly configured by the microwave oscillators 655-1 and 655-2, the waveguides 654-1 and 654-2, and the electromagnetic wave introduction ports 653-1 and 653-2.

The controller 121 described later is connected to each of the microwave oscillators 655-1 and 655-2. The quartz plate 101a or 101b accommodated in the process chamber 201 or the temperature sensor 263 for measuring the temperature of the wafer 200 is connected to the controller 121. The temperature sensor 263 measures the temperature of the quartz plate 101 or the wafer 200 by the above-described method, and transmits the measured temperature to the controller 121. The controller 121 controls the output of the microwave oscillators 655-1 and 655-2, and controls the heating of the wafer 200. As the heating control method by the heating device, a method of controlling the heating of the wafer 200 by controlling a voltage input to the microwave oscillator 655 and a method of controlling the heating of the wafer 200 by changing a ratio of the time for which the microwave oscillator 655 is turned on to the time for which the microwave oscillator 655 is turned off can be used.

The microwave oscillators 655-1 and 655-2 are controlled by the same control signal transmitted from the controller 121. However, this present disclosure is not limited thereto, and the microwave oscillators 655-1 and 655-2 may be individually controlled by transmitting individual control signals from the controller 121 to each of the microwave oscillators 655-1 and 655-2.

Figure 4:
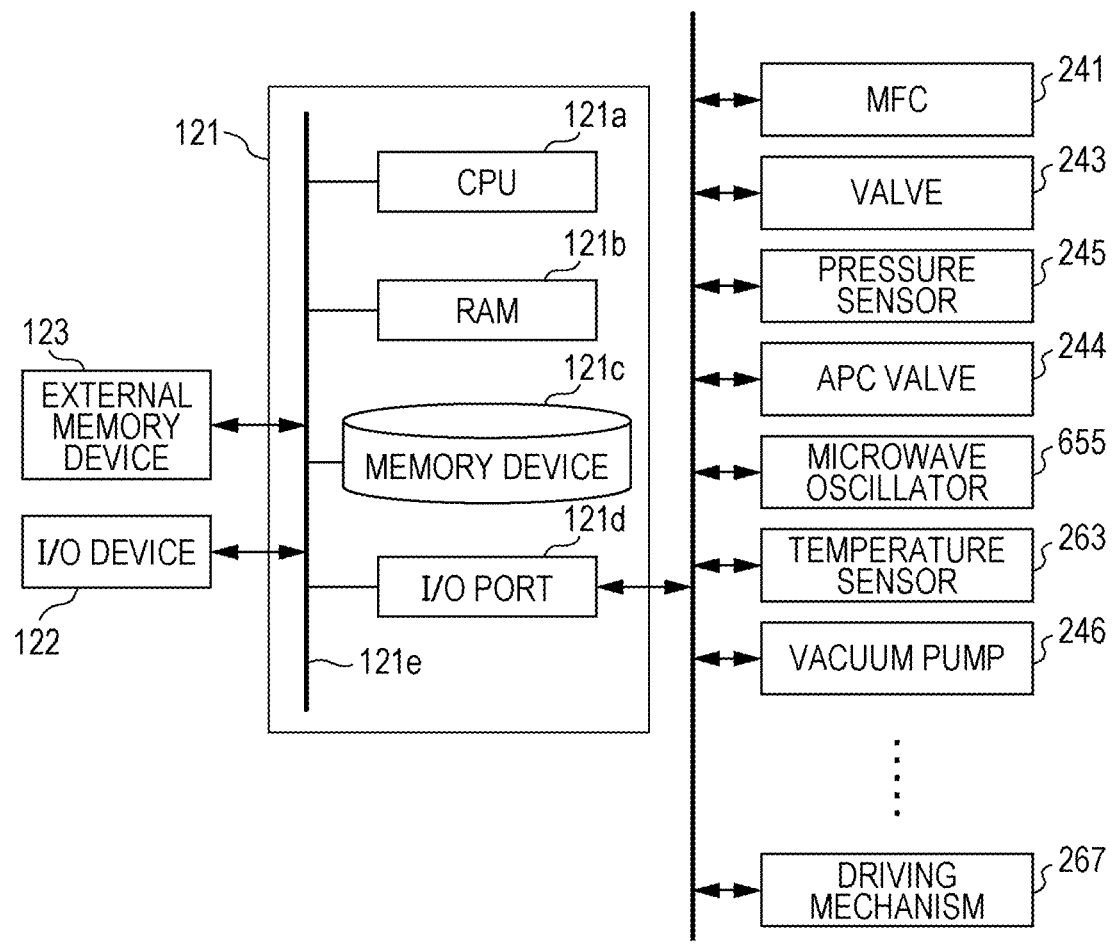
FIG. 4 is a schematic configuration diagram of a controller of a substrate processing apparatus that is suitably used in this present disclosure.

As illustrated in FIG. 4, a controller 121 that is a control section (control device, control means) is configured by a computer that includes a central processing unit (CPU) 121a, a random-access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122 that is configured as, for example, a touch panel or the like, is connected to the controller 121.

The memory device 121c is configured by, for example, a flash memory, a hard disk drive (HDD), or the like. In the memory device 121c, a control program for controlling an operation of a substrate processing apparatus or a process recipe including procedures or conditions of an annealing (reforming) process described later is stored to be readable. The process recipe is a combination of procedures of a substrate processing process described later so as to obtain a desired result when the procedures are performed by the controller 121, and functions as a program. Hereinafter, the process recipe, the control program, and the like will be simply and collectively referred to as a program. In addition, the process recipe is simply referred to as a recipe. When the term "program" is used in this present disclosure, it may be understood as including only a recipe alone, only a control program alone, or both of the recipe and the control program. The RAM 121b is configured as a memory area (work area) in which a program or data read by the CPU 121a is temporarily retained.

The I/O port 121d is connected to the MFC 241, the valve 243, the pressure sensor 245, the APC valve 244, the vacuum pump 246, the temperature sensor 263, the driving mechanism 267, the microwave oscillator 655, and the like.

The CPU 121a is configured to read and execute the control program from the memory device 121c and to read the recipe from the memory device 121c according to an input of an operation command from the I/O device 122, or the like. The CPU 121a is configured to control the operation of adjusting the flow rates of various gases by the MFC 241, the operation of opening and closing the valve 243, the operation of adjusting the pressure by the APC valve 244 based on the pressure sensor 245, the start and stop of the vacuum pump 246, the operation of adjusting the output of the microwave oscillator 655 based on the temperature sensor 263, the operation of adjusting the rotation and the rotating speed of the mounting table 210 (or the boat 217) by the driving mechanism 267, the elevating operation, or the like according to the contents of the read recipe.

The controller 121 can be configured by installing, on a computer, the program stored in an external memory device (for example, a magnetic disk such as a hard disk or the like, an optical disk such as a CD or the like, a magneto-optical disk such as an MO or the like, or a semiconductor memory such as a USB memory or the like) 123. The memory device 121c or the external memory device 123 is configured as a non-transitory computer-readable recording medium. Hereinafter, the memory device 121c and the external memory device 123 may be simply and collectively referred to as a recording medium (memory section). When the term "recording medium" is used in this present disclosure, it may be understood as including only the memory device 121c alone, only the external memory device 123 alone, or both of the memory device 121c and the external memory device 123. The provision of the program to the computer may be performed by using a communication unit, such as the Internet, dedicated lines, or the like, without using the external memory device 123.

Next, as one of the processes of manufacturing the semiconductor device by using the process furnace of the above-described substrate processing apparatus 100, for example, an example of a method of reforming (crystallizing) an amorphous silicon film as a silicon-containing film formed on a substrate will be described along a processing flow illustrated in FIG. 5. In the following description, the operations of the respective components constituting the substrate processing apparatus 100 are controlled by the controller 121. In addition, similar to the process furnace structure described above, even in the substrate processing process in the present embodiment, since the same recipe is used in the process furnace provided with a plurality of processing contents, that is, recipes, only the substrate processing process using one process furnace is described, and the description of the substrate processing process using the other process furnaces will be omitted.

When the term "wafer" is used in this present disclosure, it may be understood as a wafer itself, or a laminate of a wafer and a predetermined layer or film formed on a surface thereof. When the term "a surface of a wafer" is used in this present disclosure, it may be understood as a surface of a wafer itself or a surface of a predetermined layer or the like formed on a wafer. When the expression "a predetermined layer is formed on a wafer" is used in this present disclosure, it may be understood to mean that "a predetermined layer is directly formed on a surface of a wafer itself" or mean that "a predetermined layer is formed on a layer or the like formed on a wafer." A case in which the term "substrate" is used in this present disclosure is synonymous with the case in which the term "wafer" is used.

As illustrated in FIG. 1, the transfer device 125 ejects a predetermined number of wafers 200 to be processed from the pod 110 opened by the load port unit 106, and mounts the wafers 200 on one or both of the tweezers 125a-1 and 125a-2 (S501).

As illustrated in FIG. 3, the wafers 200 mounted on one or both of the tweezers 125a-1 and 125a-2 are loaded (boat-loaded) into the predetermined process chamber 201 by the opening/closing operation of the gate valve 205 (S502).

When the loading of the boat 217 into the process chamber 201 is completed, the atmosphere in the process chamber 201 is controlled such that the inside of the process chamber 201 has a predetermined pressure (for example, 10 Pa to 102,000 Pa). Specifically, while the atmosphere is exhausted by the vacuum pump 246, the degree of valve opening of the pressure regulator 244 is feedback-controlled based on pressure information detected by the pressure sensor 245, such that the inside of the process chamber 201 is set to a predetermined pressure. At the same time, the electromagnetic wave supply section may be controlled as the preliminary heating, and the heating may be controlled to a predetermined temperature (S503). When the temperature is raised to a predetermined substrate processing temperature by the electromagnetic wave supply section, it is preferable to raise the temperature with the output smaller than the output of the reforming process described later such that the wafer 200 is not deformed or damaged. When the substrate processing is performed under atmospheric pressure, the control may be performed to proceed to an inert gas supplying process S504 to be described later after only adjusting the temperature in the furnace, without adjusting the furnace internal pressure.

When the pressure and temperature inside the process chamber 201 are controlled to predetermined values in the furnace internal pressure and temperature adjusting process S503, the driving mechanism 267 rotates the shaft 255 and rotates the wafer 200 via the boat 217 on the mounting table 210. At this time, an inert gas such as nitrogen gas is supplied through the gas supply pipe 232 (S504). At this time, the pressure in the process chamber 201 is adjusted to a predetermined value within a range of 10 Pa to 102,000 Pa, for example, 101,300 Pa to 101,650 Pa. The shaft may be rotated at the time of the substrate loading process S502, that is, after the loading of the wafer 200 into the process chamber 201 is completed.

When the inside of the process chamber 201 is maintained at a predetermined pressure, the microwave oscillator 655 supplies microwaves into the process chamber 201 through the above-described components. The microwaves are supplied to the process chamber 201 to heat the wafer 200 to a temperature of 100° C. or more and 1,000° C. or less, preferably 400° C. or more and 900° C. or less, and more preferably 500° C. or more and 700° C. or less. By processing the substrate at such a temperature, the substrate processing is performed at a temperature at which the wafer 200 efficiently absorbs the microwave, and the speed of the reforming process can be improved. In other words, if the wafer 200 is processed at a temperature lower than 100° C. or a temperature higher than 1,000° C., the surface of the wafer 200 is altered and it becomes difficult to absorb microwaves. Due to this, it becomes difficult to heat the wafer 200. Therefore, it is preferable to perform substrate processing in the above-described temperature range.

In the present embodiment in which the heating is performed by the microwave heating method, a standing wave is generated in the process chamber 201, and a heating concentration area (hot spot) that is locally heated and the other unheated area (non-heated area) are generated on the wafer 200 (when the susceptor 103 is mounted, the susceptor 103 is also the same as wafer 200). In order to suppress deformation of the wafer 200 (when the susceptor 103 is mounted, the susceptor 103 is also the same as the wafer 200), the generation of the hot spot on the wafer 200 is suppressed by controlling ON/OFF of the power supply of the electromagnetic wave supply section. At this time, by lowering the power supplied from the electromagnetic wave supply section, it is also possible to suppress the deformation of the wafer 200 by performing control to reduce the influence of the hot spot. However, in this case, since the energy irradiated to the wafer 200 or the susceptor 103 is reduced, the rising temperature is also reduced, and the heating time needs to be extended.

As described above, when the temperature sensor 263 is a non-contact type temperature sensor and deformation or breakage occurs in the wafer 200 to be measured (when the susceptor 103 is mounted, the susceptor 103 is also the same as the wafer 200), the position of the wafer 200 monitored by the temperature sensor or the measurement angle with respect to the wafer 200 changes. Therefore, the measured value (monitored value) is inaccurate and the measured temperature changes rapidly. In the present embodiment, the rapid change in the measured temperature of the radiation thermometer along with such deformation or breakage of the measurement target is used as a trigger to turn on/off the electromagnetic wave supply section.

As described above, the microwave oscillator 655 is controlled to heat the wafer 200 such that an amorphous silicon film formed on the surface of the wafer 200 is reformed (crystallized) into a polycrystalline silicon film (S505). That is, the wafer 200 can be uniformly reformed. When the measured temperature of the wafer 200 is higher or lower than the above-described threshold value, the output of the microwave oscillator 655 is controlled to be low, instead of turning off the microwave oscillator 655. In this manner, the temperature of the wafer 200 may be set to a predetermined temperature range. In this case, when the temperature of the wafer 200 is returned to the temperature within the predetermined range, the output of the microwave oscillator 655 is controlled to be high.

When a preset processing time has elapsed, the rotation of the boat 217, the supply of the gas, the supply of the microwave, and the exhaust of the exhaust pipe are stopped.

After the pressure in the process chamber 201 is returned to atmospheric pressure, the gate valve 205 is opened to spatially communicate the process chamber 201 with the transfer chamber 203. After that, the wafer 200 mounted on the boat is unloaded to the transfer chamber 203 by the tweezers 125a of the transfer device 125 (S506).

The wafer 200 unloaded by the tweezers 125a is moved to the cooling area by the continuous operation of the transfer device 125b and the transfer device elevator 125c, and is mounted on the wafer cooling mounting tool 108 by the tweezers 125a. Specifically, the wafer 200a held by the tweezers 125a-1 after the reforming process S505 is transferred to the wafer cooling mounting tool 108, and is mounted for a predetermined time to cool the wafer 200a (S507).

Since the cooling area is arranged in the vicinity of the clean unit 166 as illustrated in FIG. 1, it is possible to efficiently cool the wafer 200a that is in high heat by the reforming process S505, it is also possible to use gas with few impurities or particles, and it is also possible to suppress the film quality deterioration of the thin film formed on the wafer 200a. In addition, since the wafer cooling mounting tool 108 is provided with a disk-shaped top plate having a diameter equal to or larger than that of the wafer 200, it is possible to suppress deformation of the wafer 200 without being able to uniformly cool the wafer 200 due to rapid cooling by the direct spray of the downflow 111 from the clean unit 166 to the wafer 200.

By repeating the above-described operation, the wafer 200 is reformed, and the process proceeds to the next processing process. At this time, the number of times of executions of the substrate processing process performed in each process chamber 201, in particular, the reforming process S505 can be stored in the memory device 121c or the external memory device 123.

In addition, although the case in which the substrate processing is performed by mounting two wafers 200 on the boat 217 has been described with reference to FIG. 3, this present disclosure is not limited thereto. The same process may be performed by mounting one wafer on the boat 217 installed in each of the process chambers 201-1 and 201-2, and the wafers 200 may be processed two by two in the process chambers 201-1 and 201-2. At this time, the transfer destination of the wafer 200 may be controlled such that the numbers of times of substrate processing performed in the process chambers 201-1 and 201-2 coincide with each other. By performing control in this manner, the number of times of executions of substrate processing in each of the process chambers 201-1 and 201-2 becomes constant, and maintenance work such as maintenance can be efficiently performed. For example, when the process chamber that transferred the wafer 200 last time is the process chamber 201-1, the number of times of executions of substrate processing in each of the process chambers 201-1 and 201-2 can be controlled by performing control such that the transfer destination of the next wafer 200 is the process chamber 201-2.

Next, with reference to FIGS. 6, 7A, 7B, 8A to 8E, and 9A to 9C, an example using the process chamber 201-1 will be described as a method of adjusting the substrate mounting position. Since the adjustment method in the case of using the process chamber 201-2 is the same as the adjustment method of the process chamber 201-1, the detailed description thereof will be omitted.

In the following description, the operations of the respective components constituting the substrate processing apparatus 100 are controlled by the controller 121, as in the substrate processing process. In addition, in the following description, the reference position in the process chamber 201-1 of FIG. 7A and FIG. 8A, the position No. 1 of FIG. 7A and FIG. 8B, the position No. 2 of FIG. 7A and FIG. 8C, the position No. 3 of FIG. 7A and FIG. 8D, and the position No. 4 of FIG. 7A and FIG. 8E will be described in correspondence with each other. In FIGS. 8B to 8E, a circle indicated by a solid line indicates the wafer mounting position that is a reference position. In addition, in FIGS. 8A to 8E, a circle indicated by a broken line indicates the mounting position of the wafer that is the movement destination. Furthermore, the X-axis, the Y-axis, and the positive and negative directions thereof are as indicated by arrows in FIG. 8A and are common to FIGS. 8B to 8E.

Figure 7B:
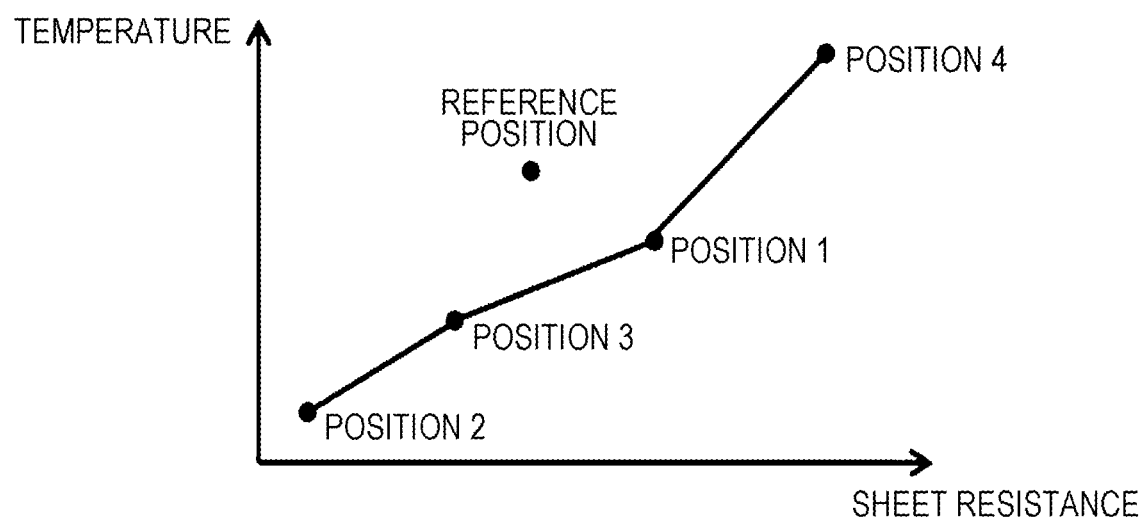
FIG. 7B is a graph showing a relationship between a temperature and a sheet resistance when a substrate is mounted at each position.

In adjusting the substrate mounting position, in each of the process chambers 201-1 and 201-2 as illustrated in FIG. 7A, with respect to each of a plurality of predetermined substrate positions (reference position, position Nos. 1 to 4 or 5 to 8), temperature of a mounted wafer, sheet resistance (Rs) of the mounted wafer, a temperature difference from temperature of the mounted wafer at the reference position (hereafter simply referred to as temperature difference), and an allowable range of temperature of the mounted wafer are measured, and a table of them is created and stored in the memory device 121c or the external memory device 123. As illustrated in FIG. 7B, the measured temperature and Rs of each position and the reference position may be graphed and output to the I/O device 122 such that visual determination can be made.

Figure 8A:
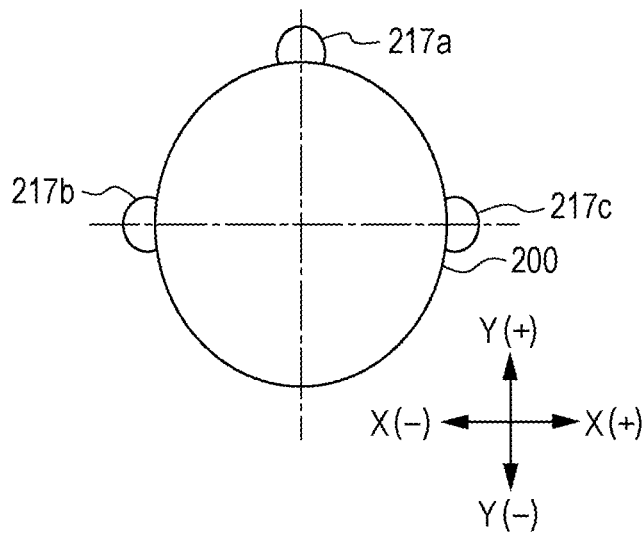
FIG. 8A is a schematic diagram illustrating a case in which a substrate is held at a reference position of a substrate holder.
Figure 8B:
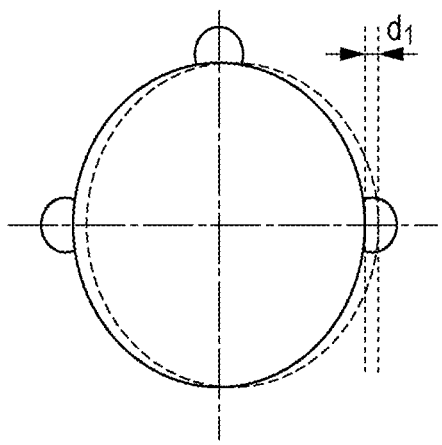
FIG. 8B is a schematic diagram illustrating a case in which the substrate is held at position No. 1 of the substrate holder in FIG. 7A.
Figure 8C:
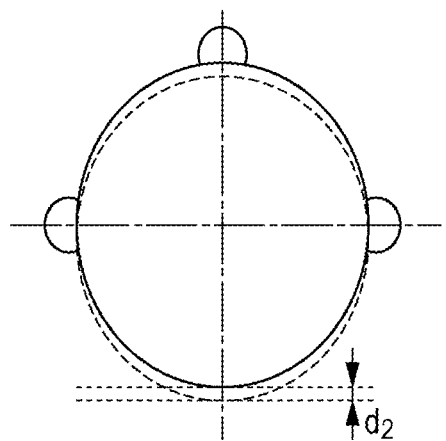
FIG. 8C is a schematic diagram illustrating a case in which the substrate is held at position No. 2 of the substrate holder in FIG. 7A.
Figure 8D:
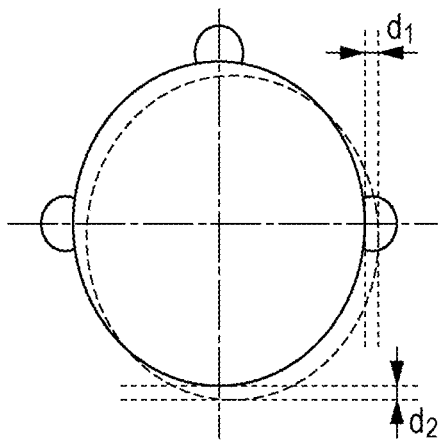
FIG. 8D is a schematic diagram illustrating a case in which the substrate is held at position No. 3 of the substrate holder in FIG. 7A.
Figure 8E:
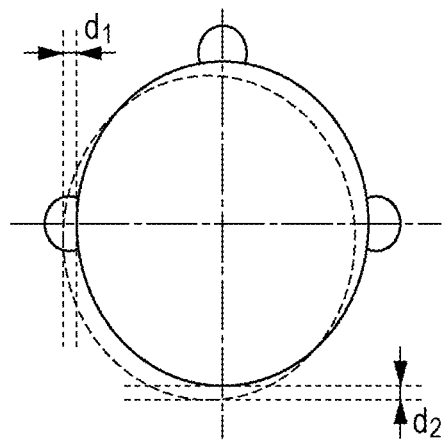
FIG. 8E is a schematic diagram illustrating a case in which the substrate is held at position No. 4 of the substrate holder in FIG. 7A.

Specifically, as illustrated in FIG. 8A, in the process chamber 201-1, the position when the center of the wafer is mounted at the position at which the wafer 200 is mounted at an equal interval from the wafer holding pillars 217a to 217c of the boat 217 is set as the reference position, and the X-axis coordinate and the Y-axis coordinate are set. As illustrated in FIG. 8B, the mounting position of the wafer 200 shifted by +3 mm in the X-axis direction from the reference position is set as position No. 1. Similarly, as illustrated in FIG. 8C, the mounting position of the wafer 200 shifted by −3 mm in the Y-axis direction from the reference position is set as position No. 2. Similarly, as illustrated in FIG. 8D, the mounting position of the wafer 200 shifted by +1.5 mm in the X-axis direction and −1.5 mm in the Y-axis direction from the reference position is set as position No. 3. Similarly, as illustrated in FIG. 8E, the mounting position of the wafer 200 shifted by −1.5 mm in the X-axis direction and −2 mm in the Y-axis direction from the reference position is set as position No. 4. After each mounting position is determined, the substrate processing process is performed for each position, the temperature sensor 263 measures the temperature of the wafer 200 for each position, and the allowable range of the measured temperature is determined. In addition, Rs sets in advance a common measurement point for the wafer 200 processed at each position and can be measured and stored by an RS measurement apparatus after the substrate processing at each position.

Although the number of positions stored in the present embodiment is five including the reference position for each process chamber, this present disclosure is not limited thereto. The number of positions may be two or more including at least the reference position. Preferably, four or more positions and ten or less positions may be stored. When a temperature difference larger than the temperature stored in the table illustrated in FIG. 7A (for example, the measured temperature is lower than 535° C. or higher than 625° C. in FIG. 7A) is measured, that is, when the measured temperature is determined to be out of the allowable range, it may be determined that an abnormality has occurred in the electromagnetic wave supply section, the subsequent processing process may be stopped, and maintenance may be prompted by notifying an alarm.

In addition, in the process chamber 201-2 as in the process chamber 201-1, it is possible to create a table by setting positions and collecting various data.

When the above-described substrate processing process is completed, it is determined whether a predetermined number of times of substrate processing processes has been performed in the target process chamber 201 (either or both of the process chamber 201-1 and 201-2) (S601). When it is determined that the predetermined number of times of substrate processing processes have not been performed in the target process chamber 201, the above-described substrate processing process is resumed.

When the substrate processing process has been performed a predetermined number of times in the number-of-times-of-substrate-processing determination S601, it is determined whether the adjustment of the substrate mounting position is necessary (S602). In this determination, it is determined whether the electromagnetic field distribution generated on the wafer 200 exists at a predetermined position. That is, it is determined whether the substrate temperature for estimating the electromagnetic field distribution or the value of Rs is within the range of numerical values stored in the table as illustrated in FIG. 7A. When it is determined that the adjustment is unnecessary in this determination, the above-described substrate processing process is resumed.

For example, specifically, it is determined that the adjustment of the substrate mounting position is necessary in any one of the cases in which the above-described substrate processing process is performed at the reference position, the case in which the measured temperature during the substrate processing is measured as a temperature higher (or lower) than 600° C.±5° C., which is the temperature within the allowable range of the reference position, the case in which Rs at the time of Rs measurement is smaller (or larger) than 30 Ω/sq, and the case in which the measured temperature at the time of substrate processing is measured as a temperature higher (or lower) than the allowable range of 600° C.±5° C. and Rs at the time of Rs measurement is a value smaller (or larger) than 30 Ω/sq.

When it is determined in the position adjustment necessity determination S602 that the adjustment is necessary, the mounting position of the substrate is determined based on the stored table according to the measured value of the temperature or Rs (S603).

For example, specifically, when the temperature measured at the reference position is 610° C., a temperature difference of +10° C. from the measured temperature (600° C.) of the reference position stored in the determination table occurs. Therefore, position No. 1 that becomes a temperature difference −10° C. stored in the determination table is selected and the mounting position of the wafer 200 is determined, such that the measured temperature at the measurement position becomes 600° C. (the same temperature as the measured temperature at the reference position).

At this time, even when it is determined not as the measured temperature but as the Rs measurement value, that is, even when the Rs measurement value is 32 Ω/sq, position No. 2 at which Rs of −2 Ω/sq is stored is selected, and the mounting position of the wafer 200 is determined, such that Rs becomes the 30 Ω/sq of the reference position, with reference to the determination table, as in the response determined by the measured temperature.

When the mounting position is determined in the above-described substrate mounting position determination S603, the transfer device 125 is set to be controlled such that the wafer 200 is mounted at the determined position (S604).

Figures 9A, 9B, 9C:
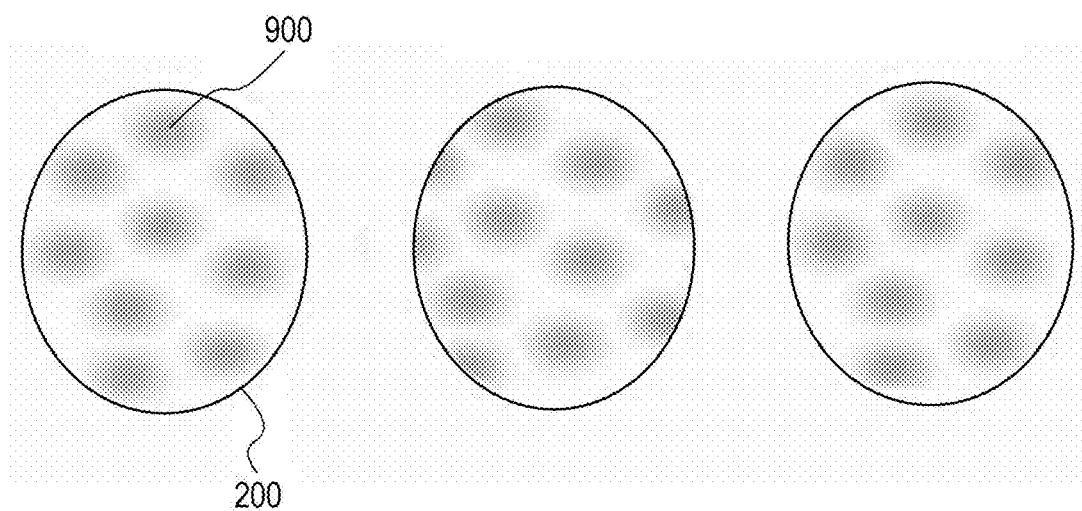
FIG. 9A is a schematic diagram illustrating an electromagnetic field distribution generated on a substrate in a normal state.
FIG. 9B is a schematic diagram illustrating an electromagnetic field distribution generated on a substrate after a process is performed twice or more.
FIG. 9C is a schematic diagram illustrating an electromagnetic field distribution generated on a substrate after substrate mounting position adjustment.

For example, specifically, when the mounting position is determined to be the position No. 1, as illustrated in FIG. 8B, the wafer mounting position is set to be shifted by d1 (+3 mm in the present embodiment) in the X-axis direction. After setting in this manner, by resuming the above-described substrate processing process, the electromagnetic field distribution may be matched by matching the substrate temperature or the value of Rs. Specifically, it becomes the electromagnetic field distribution as illustrated in FIG. 9C from the electromagnetic field distribution as illustrated in FIG. 9B, and it is possible to obtain an electromagnetic field distribution equivalent to that in the normal state illustrated in FIG. 9A. When the mounting position is determined to be position No. 4, the wafer mounting position is set to be shifted by d1 (−1.5 mm in the present embodiment) in the X axis direction and d2 (−2 mm in the present embodiment) in the Y axis direction. The same applies to the case in which the mounting position is another position No.

According to the present embodiment, one or more of the following described below may be obtained.

(a) It is possible to process the substrate uniformly without adjusting the electromagnetic field distribution.

(b) Since it is not necessary to adjust the electromagnetic field distribution, it is possible to obtain the process reproducibility of the substrate by simple control.

Although this present disclosure has been described according to the embodiments, each above-described embodiment, each modification example, and the like can be combined as appropriate and the effects thereof can also be obtained.

For example, in each of the above-described embodiments, the process of reforming the amorphous silicon film into the polycrystalline silicon film as the film including silicon as the main component has been described, but this present disclosure is not limited thereto. A film formed on the surface of the wafer 200 may be reformed by supplying a gas including at least one of oxygen (O), nitrogen (N), carbon (C), and hydrogen (H). For example, in a case where a hafnium oxide film ($Hf_xO_y$ film) as a high-dielectric-constant film is formed on the wafer 200, deficient oxygen in the hafnium oxide film is supplemented by supplying the microwave while supplying the oxygen-containing gas and heating the oxygen-containing gas, thereby improving characteristics of the high-dielectric-constant film.

Although the hafnium oxide film has been described herein, this present disclosure is not limited to the hafnium oxide film. This present disclosure can be preferably applied to the case of reforming a metal-based oxide film, that is, an oxide film including at least one metal element of aluminum (Al), titanium (Ti), zirconium (Zr), tantalum (Ta), niobium (Nb), lanthanum (La), cerium (Ce), yttrium (Y), barium (Ba), strontium (Sr), calcium (Ca), lead (Pb), molybdenum (Mo), and tungsten (W). That is, the above-described film forming sequence can also be preferably applied to the case of reforming, on the wafer 200, a TiOCN film, a TiOC film, a TiON film, a TiO film, a ZrOCN film, a ZrOC film, a ZrON film, a ZrO film, a HfOCN film, a HfOC film, a HfON film, a HfO film, a TaOCN film, a TaOC film, a TaON film, a TaO film, a NbOCN film, a NbOC film, a NbON film, a NbO film, an AlOCN film, an AlOC film, an AlON film, an AlO film, a MoOCN film, a MoOC film, a MoON film, a MoO film, a WOCN film, a WOC film, a WON film, or a WO film.

In addition, this present disclosure is not limited to the high-dielectric-constant film, a film including silicon doped with impurities as a main component may be heated. As the film including silicon as the main component, there are a Si-based oxide film such as a silicon nitride film (SiN film), a silicon oxide film (SiO film), a silicon oxycarbide film (SiOC film), a silicon oxycarbonitride film (SiOCN film), or a silicon oxynitride film (SiON film). Examples of the impurities include at least one of bromine (B), carbon (C), nitrogen (N), aluminum (Al), phosphorus (P), gallium (Ga), and arsenic (As)

In addition, it may be a resist film based on at least one of a methyl methacrylate resin (polymethyl methacrylate (PMMA)), an epoxy resin, a novolac resin, and a polyvinyl phenyl resin.

In addition, one of the processes of manufacturing the semiconductor device has been described above, but this present disclosure is not limited thereto. This present disclosure can also be applied to substrate processing technology such as a patterning process of a liquid crystal panel manufacturing process, a patterning process of a solar cell manufacturing process, or a patterning process of a power device manufacturing process.

As described above, according to this present disclosure, it is possible to provide an electromagnetic wave substrate processing technology capable of performing uniform substrate processing without adjusting the magnetic field distribution.

The invention claimed is:
1. A method of manufacturing a semiconductor device, the method comprising:
transferring a substrate to a process chamber and mounting the substrate on a substrate holder;
heating the substrate with a heating device to perform predetermined substrate processing;
determining the number of times of the predetermined substrate processing that has been performed after the performing of the predetermined substrate processing is completed;
when it is determined, in the determining of the number of times of the predetermined substrate processing, that the predetermined substrate processing has been performed a preset number of times or more, determining whether it is necessary to adjust a mounting position at which the substrate is mounted on the substrate holder; and
when it is determined, in the determining of whether it is necessary to adjust the mounting position, that a mounting position adjustment is necessary, determining the mounting position by comparing substrate temperature measured at the performing the predetermined substrate processing with a premeasured temperature of the substrate which corresponds to the mounting position and is stored in a memory.

2. The method of manufacturing a semiconductor device according to claim 1, wherein the memory is configured to store sheet resistance at a predetermined position on the surface of the substrate, and the determining of whether it is necessary to adjust the mounting position comprises determining whether it is necessary to adjust the mounting position by comparing a value of the sheet resistance with a value of a reference sheet resistance measured in advance.

3. The method of manufacturing a semiconductor device according to claim 1, wherein when it is determined, in the determining of whether it is necessary to adjust the mounting position, that a temperature measured by a temperature sensor is higher or lower than an allowable temperature range stored in the memory, it is determined that an abnormality has occurred in the heating device and a subsequent process is stopped.

4. The method of manufacturing a semiconductor device according to claim 1, wherein in the determining of the mounting position of the substrate, a position at which the temperature measured by a temperature sensor is the same temperature as the premeasured temperature of the substrate at a reference position stored in the memory is determined as the mounting position of the substrate after the mounting position is adjusted.

5. A substrate processing apparatus comprising:
a process chamber configured to process a substrate held by a substrate holder;
a heating device configured to heat the substrate by an electromagnetic wave;
a transfer device configured to transfer the substrate to the substrate holder;
a temperature sensor configured to measure a temperature of the substrate;
a memory configured to store at least a mounting position of the substrate mounted on the substrate holder and a measured temperature of the substrate corresponding to the mounting position, the measured temperature being measured by the temperature sensor; and
a controller configured to control the heating device and the transfer device according to information stored in the memory,
wherein the controller is configured to:
heat the substrate by the heating device to perform predetermined substrate processing;

determine the number of times of the predetermined substrate processing that has been performed after the predetermined substrate processing is completed;

when it is determined that the predetermined substrate processing has been performed a preset number of times or more, determine whether it is necessary to adjust a mounting position at which the substrate is mounted on the substrate holder; and when it is determined that a mounting position adjustment is necessary, determine the mounting position of the substrate by comparing the substrate temperature measured at the time of performing the predetermined substrate processing with a premeasured temperature of the substrate which corresponds to the mounting position and is stored in a memory.

6. The substrate processing apparatus according to claim 5, wherein the memory is configured to store sheet resistance at a predetermined position on the surface of the substrate, and the controller is configured to perform control to determine whether it is necessary to adjust the mounting position by comparing a value of the sheet resistance with a value of a reference sheet resistance measured in advance.

7. The substrate processing apparatus according to claim 5, wherein when it is determined that a temperature measured by a temperature sensor is higher or lower than an allowable temperature range stored in the memory, the controller is configured to perform control to determine that an abnormality has occurred in the heating device and stop a subsequent process.

8. The substrate processing apparatus according to claim 5, wherein the controller is configured to perform control such that a position at which the temperature measured by the temperature sensor is the same temperature as the stored premeasured temperature of the substrate at a reference position is determined as the mounting position of the substrate after the mounting position is adjusted.

9. A non-transitory computer-readable recording medium storing a program to be performed by a substrate processing apparatus, the program comprising:

transferring a substrate to a process chamber of the substrate processing apparatus and mounting the substrate on a substrate holder;

heating the substrate with a heating device to perform predetermined substrate processing;

determining the number of times of the predetermined substrate processing that has been performed after the performing of the predetermined substrate processing is completed;

when it is determined, in the determining of the number of times of the predetermined substrate processing, that the predetermined substrate processing has been performed a preset number of times or more, determining whether it is necessary to adjust a mounting position at which the substrate is mounted on the substrate holder; and when it is determined, in the determining of whether it is necessary to adjust the mounting position, that a mounting position adjustment is necessary, determining the mounting position by comparing the substrate temperature measured at the time of performing the predetermined substrate processing with a premeasured temperature of the substrate which corresponds to the mounting position and is stored in a memory.

10. The non-transitory computer-readable recording medium according to claim 9, wherein the memory is configured to store sheet resistance at a predetermined position on the surface of the substrate, and the determining of whether it is necessary to adjust the mounting position comprises determining whether it is necessary to adjust the mounting position by comparing a value of the sheet resistance with a value of a reference sheet resistance measured in advance.

11. The non-transitory computer-readable recording medium according to claim 9, wherein when it is determined, in the determining of whether it is necessary to adjust the mounting position, that a temperature measured by a temperature sensor is higher or lower than an allowable temperature range stored in the memory, it is determined that an abnormality has occurred in the heating device and a subsequent process is stopped.

12. The non-transitory computer-readable recording medium according to claim 9, wherein in the determining of the mounting position, a position at which the temperature measured by the temperature sensor is the same temperature as the premeasured temperature of the substrate at a reference position stored in the memory is determined as the mounting position of the substrate after the mounting position is adjusted.

* * * * *